(12) United States Patent
Park

(10) Patent No.: US 7,632,722 B2
(45) Date of Patent: Dec. 15, 2009

(54) LIQUID CRYSTAL DISPLAY DEVICE AND METHOD OF FABRICATING THE SAME

(75) Inventor: Yong In Park, Anyang-si (KR)

(73) Assignee: LG Display co., Ltd., Seoul (KR)

( * ) Notice: Subject to any disclaimer, the term of this patent is extended or adjusted under 35 U.S.C. 154(b) by 0 days.

(21) Appl. No.: 11/166,278

(22) Filed: Jun. 27, 2005

(65) Prior Publication Data

US 2006/0138416 A1    Jun. 29, 2006

(30) Foreign Application Priority Data

Dec. 24, 2004    (KR) .................... 10-2004-0112575

(51) Int. Cl.
*H01L 21/00* (2006.01)
*H01L 21/84* (2006.01)

(52) U.S. Cl. .................. 438/149; 438/30; 438/153; 257/59

(58) Field of Classification Search ............... 438/149, 438/153, 30; 257/59
See application file for complete search history.

(56) References Cited

U.S. PATENT DOCUMENTS

| | | | |
|---|---|---|---|
| 6,025,216 A * | 2/2000 | Ha .................... | 438/161 |
| 6,387,737 B1 * | 5/2002 | Yamazaki et al. ...... | 438/149 |
| 6,403,409 B1 | 6/2002 | You | |
| 6,573,564 B2 * | 6/2003 | Yamazaki et al. ...... | 257/353 |
| 6,617,203 B2 | 9/2003 | Kim et al. | |
| 6,753,235 B2 | 6/2004 | So et al. | |
| 2001/0003657 A1 | 6/2001 | Lee | |

FOREIGN PATENT DOCUMENTS

| | | |
|---|---|---|
| JP | 6-250217 | 9/1994 |
| JP | 2004-281687 | 10/2004 |
| KR | 97-003717 B1 | 3/1997 |
| KR | 97-008589 B1 | 5/1997 |
| KR | 97-011966 B1 | 8/1997 |
| KR | 0161461 B1 | 8/1998 |
| KR | 0175408 B1 | 11/1998 |
| KR | 0177785 B1 | 11/1998 |
| KR | 0184509 B1 | 12/1998 |
| KR | 10-0192593 B1 | 1/1999 |
| KR | 2000-0025565 | 5/2000 |

(Continued)

*Primary Examiner*—Howard Weiss
*Assistant Examiner*—Steven H Rao
(74) *Attorney, Agent, or Firm*—McKenna Long & Aldridge

(57) ABSTRACT

A display device includes a substrate having a display region and a driver region; a gate line and a data line crossing each other to define a pixel region in the display region, the pixel region having a pixel electrode; an insulation layer between the gate line and the data line; a first thin film transistor in the display region; and a second thin film transistor having a first polarity and a third thin film transistor having a second polarity in the driver region, wherein the pixel electrode, the gate line and the gate electrodes of the first to third thin film transistors have a double-layer structure in which a metal layer is formed on a transparent conductive layer, and the transparent conductive layer of the pixel electrode is exposed through a transmission hole passing through the insulation layer and the metal layer in the pixel region.

12 Claims, 12 Drawing Sheets

FOREIGN PATENT DOCUMENTS

| | | |
|---|---|---|
| KR | 2000-0026894 | 5/2000 |
| KR | 2000-0026895 | 5/2000 |
| KR | 2000-0031451 | 6/2000 |
| KR | 2000-0041223 | 7/2000 |
| KR | 2000-0075031 | 12/2000 |
| KR | 2001-019665 | 3/2001 |
| KR | 2001-0019668 | 3/2001 |
| KR | 10-0297706 | 5/2001 |
| KR | 2001-0054739 | 7/2001 |
| KR | 2001-0055071 | 7/2001 |
| KR | 2001-0056037 | 7/2001 |
| KR | 2001-0110917 | 12/2001 |
| KR | 2002-0009188 | 2/2002 |
| KR | 2002-0022258 | 3/2002 |
| KR | 2002-0071061 | 9/2002 |
| KR | 2002-0071062 | 9/2002 |
| KR | 2002-0074897 | 10/2002 |
| KR | 2002-0078116 | 10/2002 |
| KR | 2002-0079196 | 10/2002 |
| KR | 2002-0080202 | 10/2002 |
| KR | 2003-0006619 | 1/2003 |
| KR | 2003-0030286 | 4/2003 |

\* cited by examiner

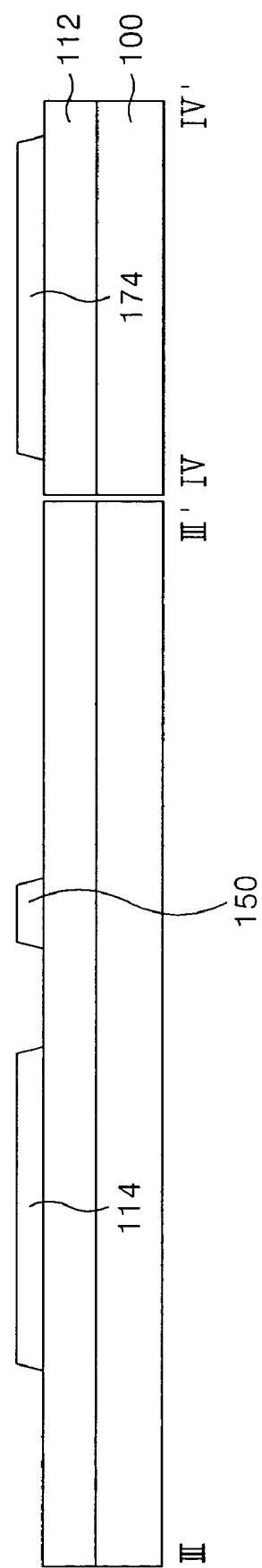

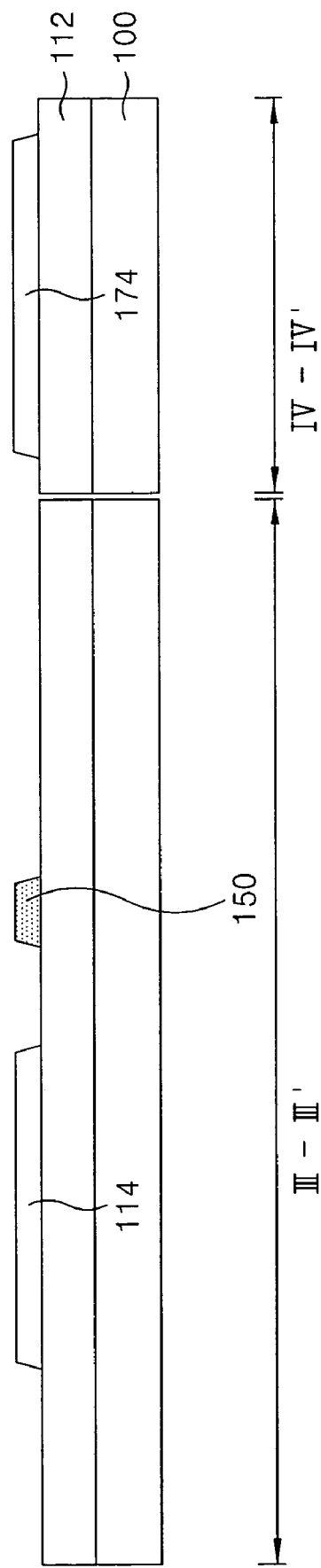

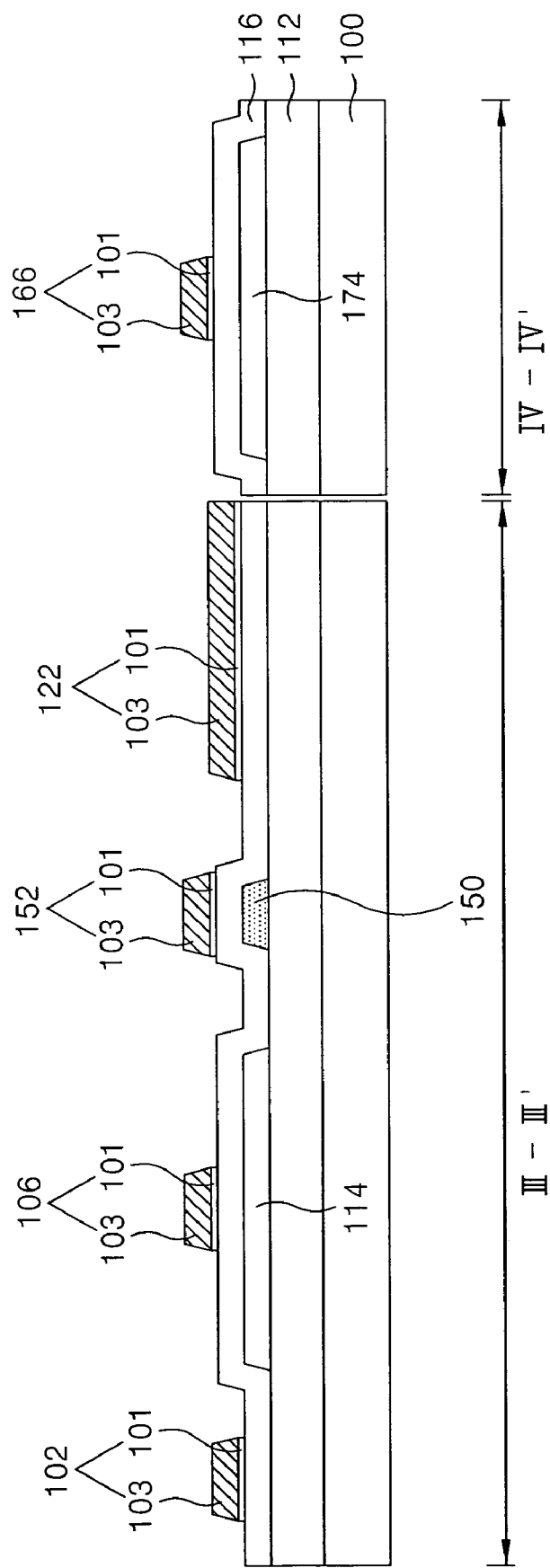

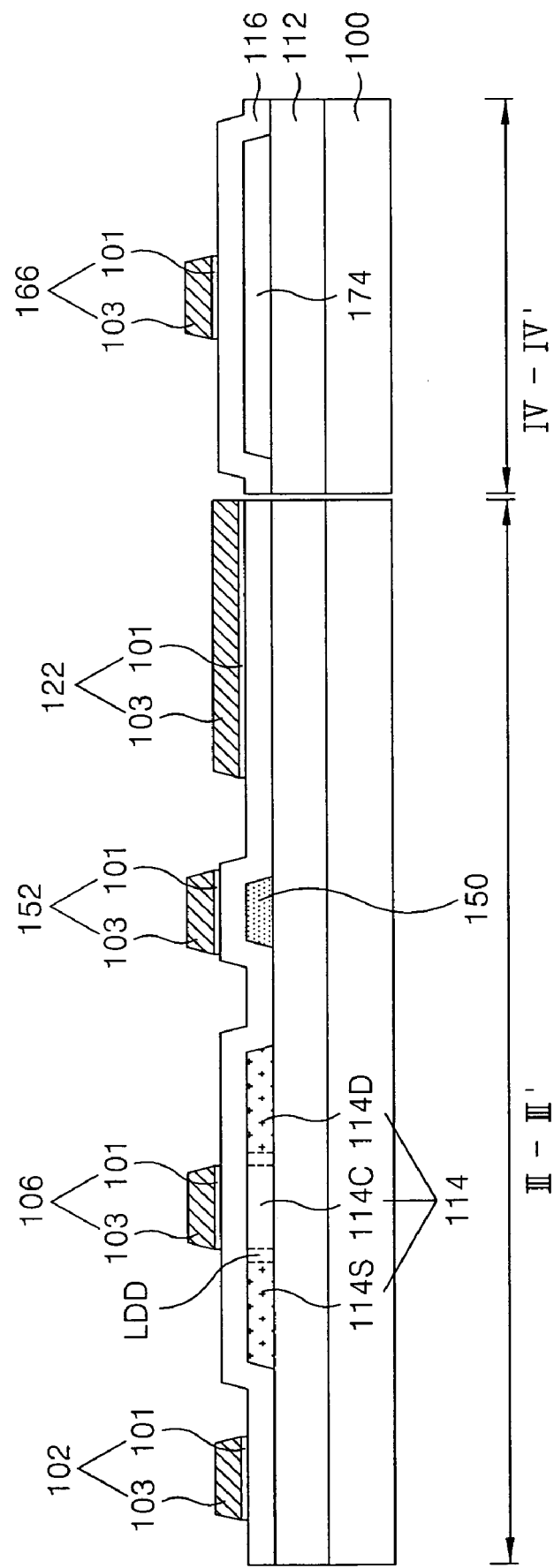

LIQUID CRYSTAL DISPLAY DEVICE AND METHOD OF FABRICATING THE SAME

This application claims the benefit of Korean Patent Application No. P2004-112575, filed on Dec. 24, 2004, which is hereby incorporated by reference for all purposes as if fully set forth herein.

BACKGROUND OF THE INVENTION

1. Field of the Invention

This invention relates to a poly-silicon display device, and more particularly to a thin film transistor substrate of a poly-silicon liquid crystal display and a simplified method of fabricating the same.

2. Discussion of the Related Art

Generally, a liquid crystal display (LCD) device, which includes a plurality of liquid crystal cells in a matrix configuration in a liquid crystal display panel, displays images by controlling the transmittance of light in accordance with video signals. In each liquid crystal cell, a thin film transistor (TFT) is used as a switching device to independently supply a video signal. An active layer of such a TFT is generally formed of either amorphous silicon or polycrystalline silicon (poly-silicon). Because the carrier mobility of poly-silicon is approximately hundred times faster than the carrier mobility of amorphous silicon, high-speed driving circuits can be integrally formed in the LCD panel with the poly-silicon technology.

FIG. 1 is a schematic view illustrating a TFT substrate of a poly-silicon liquid crystal display panel integrated with driving circuits according to the related art.

Referring to FIG. 1, the TFT substrate includes a display area 7 provided with a TFT 30 and a pixel electrode 22 in each pixel area defined by the crossings of gate lines 2 and data lines 4, a data driver 5 for driving the data lines 4, and a gate driver 3 for driving the gate lines 2.

The TFT 30 charges a video signal from the data line 4 into the pixel electrode 22 in response to a scanning signal from the gate line 2. The pixel electrode 22 charged with the video signal generates a potential difference with respect to a common electrode of a color filter substrate which faces the TFT substrate with liquid crystal therebetween. This potential difference rotates the molecules of the liquid crystal due to the dielectric anisotropy of the liquid crystal. The transmittance of light varies depending on an amount of rotation of the liquid crystal molecules, thereby implementing gray-scale levels.

The gate driver 3 sequentially drives the gate lines 2, and the data driver 5 applies video signals to the data lines 4 when one of the gate lines 2 is driven.

FIG. 2 is an enlarged plan view of one pixel area included in the display area 7 of the TFT substrate illustrate in FIG. 1, and FIG. 3 is a cross-sectional view of the pixel area of the TFT substrate taken along the line I-I' in FIG. 2.

Referring to FIGS. 2 and 3, the TFT substrate includes the thin film transistor (TFT) 30 connected to the gate line 2 and the data line 4, and the pixel electrode 22 connected to the TFT 30. Although either an NMOS-TFT or PMOS-TFT can be used for the TFT 30, the TFT 30 employing an NMOS-TFT will now be described.

The TFT 30 has a gate electrode 6 connected to the gate line 2, a source electrode connected to the data line 4, and a drain electrode 10 connected to the pixel electrode 22 via a pixel contact hole 20 passing through a protective film 18. The gate electrode 6 overlaps a channel area 14C of an active layer 14 provided on a buffer film 12 with a gate insulating film 16 therebetween. The source electrode and the drain electrode 10 are formed in such a manner to be insulated from the gate electrode 6 with an interlayer insulating film 26 therebetween. Further, the source electrode and the drain electrode 10 are connected to a source area 14S and a drain area 14D of the active layer 14 doped with an $n^+$ impurity, respectively, via a source contact hole 24S and a drain contact hole 24D passing through the interlayer insulating film 26 and the gate insulating film 16.

According to the related art, forming the display area 7 of the TFT substrate requires a six-mask process, which will now be described in detail.

The buffer film 12 is formed on a lower substrate 1 and then the active layer 14 is formed on the buffer film 12 by a first mask process. The active layer 14 is formed by depositing an amorphous silicon layer on the buffer film 12 and then crystallizing it into a poly-silicon layer using a laser, and thereafter by patterning it with photolithography and etching processes using a first mask.

The gate insulating film 16 is formed on the buffer film 12 provided with the active layer 14 and then the gate line 2 and the gate electrode 6 are formed thereon by a second mask process. Further, an $n^+$ impurity is doped into a non-overlapping area of the active layer 14 using the gate electrode 6 as a mask, thereby forming the source area 14S and the drain area 14D of the active layer 14.

The interlayer insulating film 26 is formed on the gate insulating film 16 provided with the gate line 2 and the gate electrode 6, and then source and drain contact holes 24S and 24D passing through the interlayer insulating film 26 and the gate insulating film 16 are formed by a third mask process.

The data line 4 including the source electrode and the drain electrode 10 is formed on the interlayer insulating film 26 by a fourth mask process.

The protective film 18 is formed on the interlayer insulating film 26 provided with the data line 4 and the drain electrode 10, and then the pixel contact hole 20 passing through the protective film 18 is formed by a fifth mask process to expose the drain electrode 10.

The transparent pixel electrode 22 connected to the drain electrode 10 via the pixel contact hole 20 is formed on the protective film 18 by a sixth mask process.

As described above, the display area 7 of the TFT substrate is formed by a six-mask process according to the related art. Because each mask process includes many sub-processes such as deposition, cleaning, photolithography, etching, photo-resist stripping and inspection, etc., the manufacturing process is complicated and the manufacturing cost is high. Furthermore, when the gate driver 3 and the data driver 5 are integrally formed with the display area 7 with the CMOS-TFT technology, a nine-mask process is generally required, thereby further complicating the manufacturing process.

SUMMARY OF THE INVENTION

Accordingly, the present invention is directed to a thin film transistor substrate of poly-silicon display device and method of fabricating the same that substantially obviates one or more of the problems due to limitations and disadvantages of the related art.

An advantage of the present invention is to provide a thin film transistor substrate of a poly-silicon display device and a simplified method of fabricating the same.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the present invention, as embodied and broadly described, a display device according to the present invention includes a substrate having a display region and a driver region; a gate line and a data line crossing each other to define a pixel region in the display region, the pixel region having a pixel electrode; an insulation layer between the gate line and the data line; a first thin film transistor in the display region, the first thin film transistor connected to the gate and data lines and the pixel electrode; and a second thin film transistor having a first polarity and a third thin film transistor having a second polarity in the driver region, the first polarity being different from the second polarity, wherein the pixel electrode, the gate line and the gate electrodes of the first to third thin film transistors have a double-layer structure in which a metal layer is formed on a transparent conductive layer, and the transparent conductive layer of the pixel electrode is exposed through a transmission hole passing through the insulation layer and the metal layer in the pixel region.

In another aspect of the present invention, a method of fabricating a display device includes forming first to third active layers on a substrate; forming a first insulating film on the active layers; forming a first conductive pattern including first, second, and third gate electrodes, a gate line connected to the first gate electrode, and a pixel electrode on the first insulating film, wherein the first conductive pattern has a double-layer structure in which a metal layer is formed on a transparent conductive layer; forming source and drain regions doped with a first impurity on the first and second active layers; forming source and drain regions doped with a second impurity on the third active layer; forming a second insulating film on the first conductive pattern; forming source and drain contact holes exposing the source and drain regions of the first, second and third active layers and forming a transmitting hole exposing the transparent conductive layer of the pixel electrode; and forming a second conductive pattern including data line and first, second and third source and drain electrodes connected to the source and drain regions of the first, second and third active layers, wherein the first drain electrode is connected to the transparent conductive layer of the pixel electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 6A to FIG. 6G are cross-sectional views illustrating a method of fabricating a thin film transistor substrate of a poly-silicon display device according to an embodiment of the present invention.

DETAILED DESCRIPTION OF THE ILLUSTRATED EMBODIMENTS

Reference will now be made in detail to embodiments of the present invention, examples of which are illustrated in the accompanying drawings.

Figure 1:
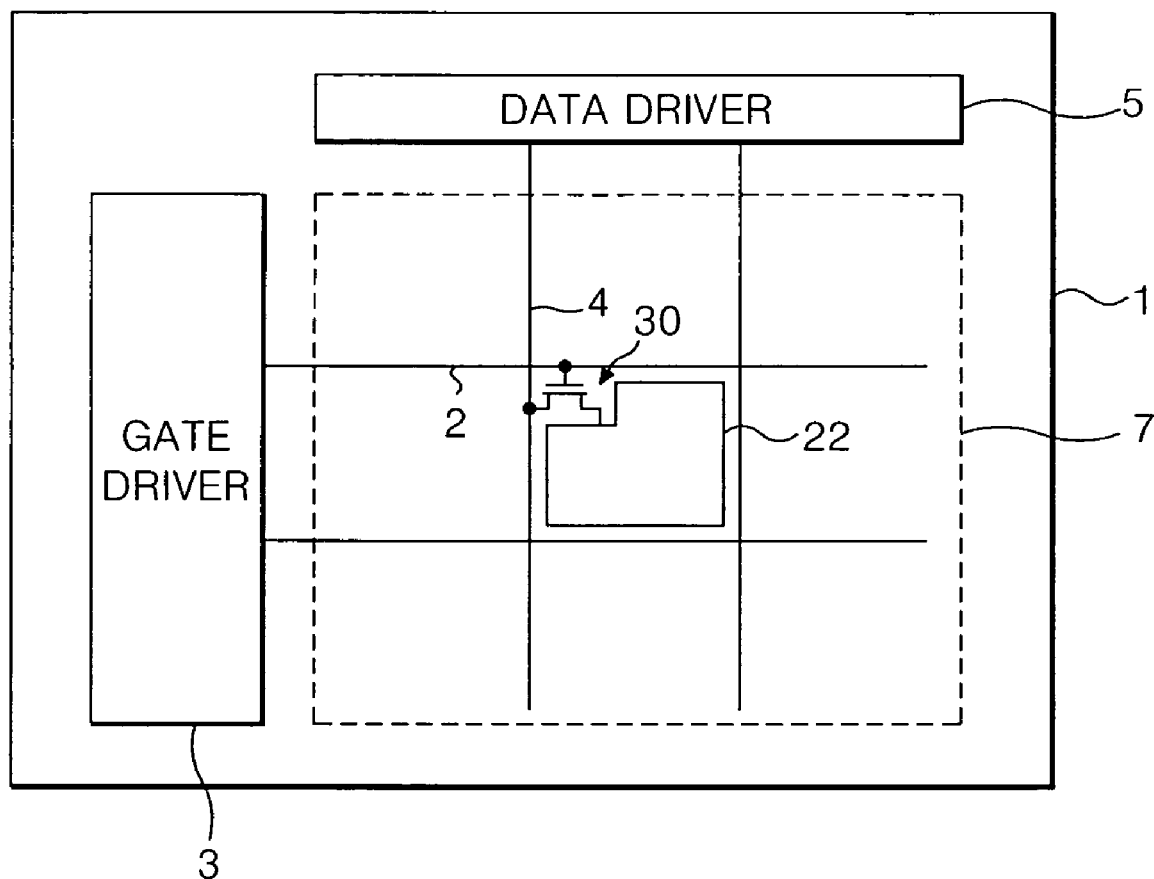
FIG. 1 is a schematic view illustrating a TFT substrate of a poly-silicon liquid crystal display panel integrated with driving circuits according to the related art.
Figure 2:
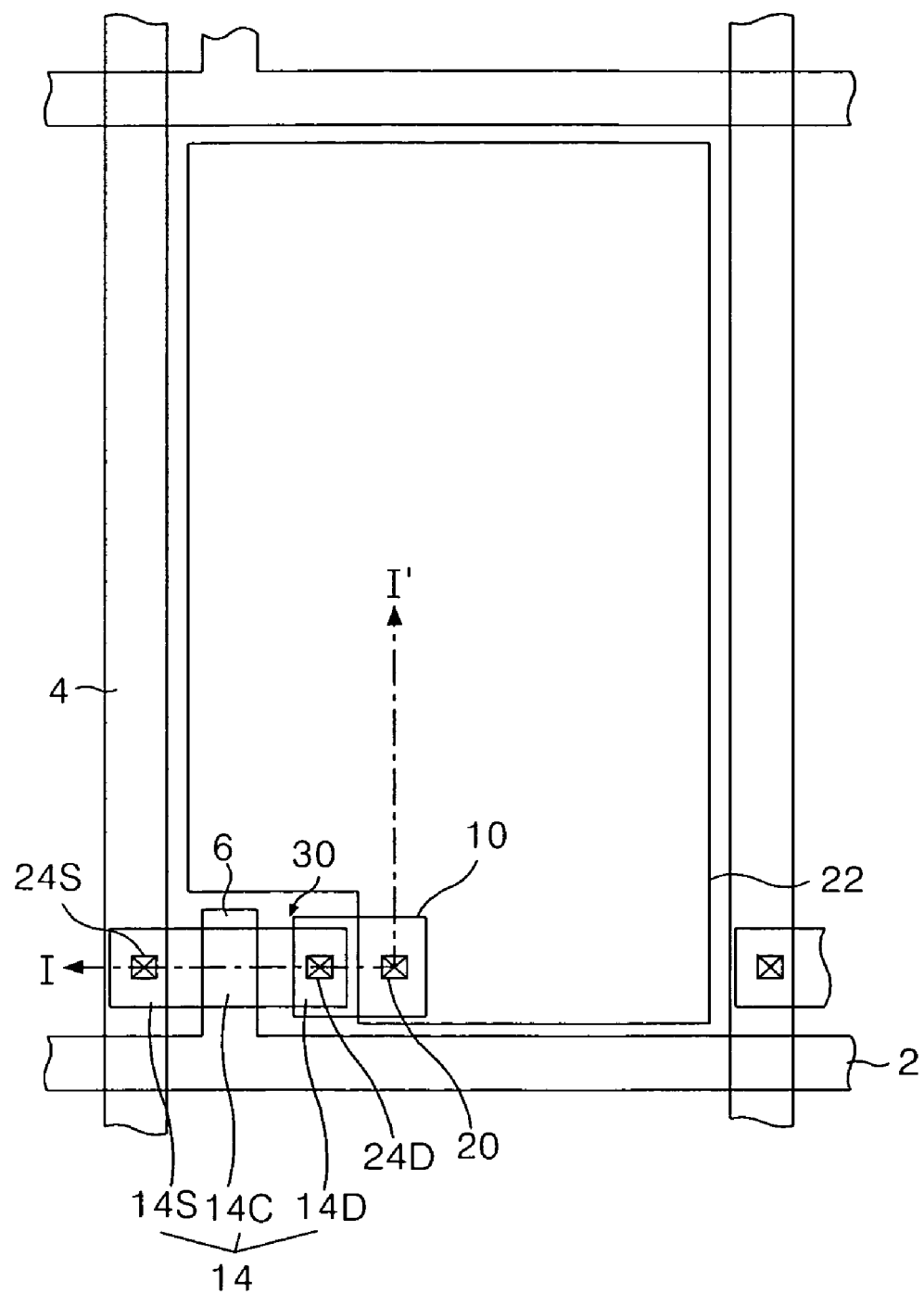
FIG. 2 is an enlarged plan view of one pixel area included in the display area 7 of the TFT substrate illustrate in FIG. 1.
Figure 3:
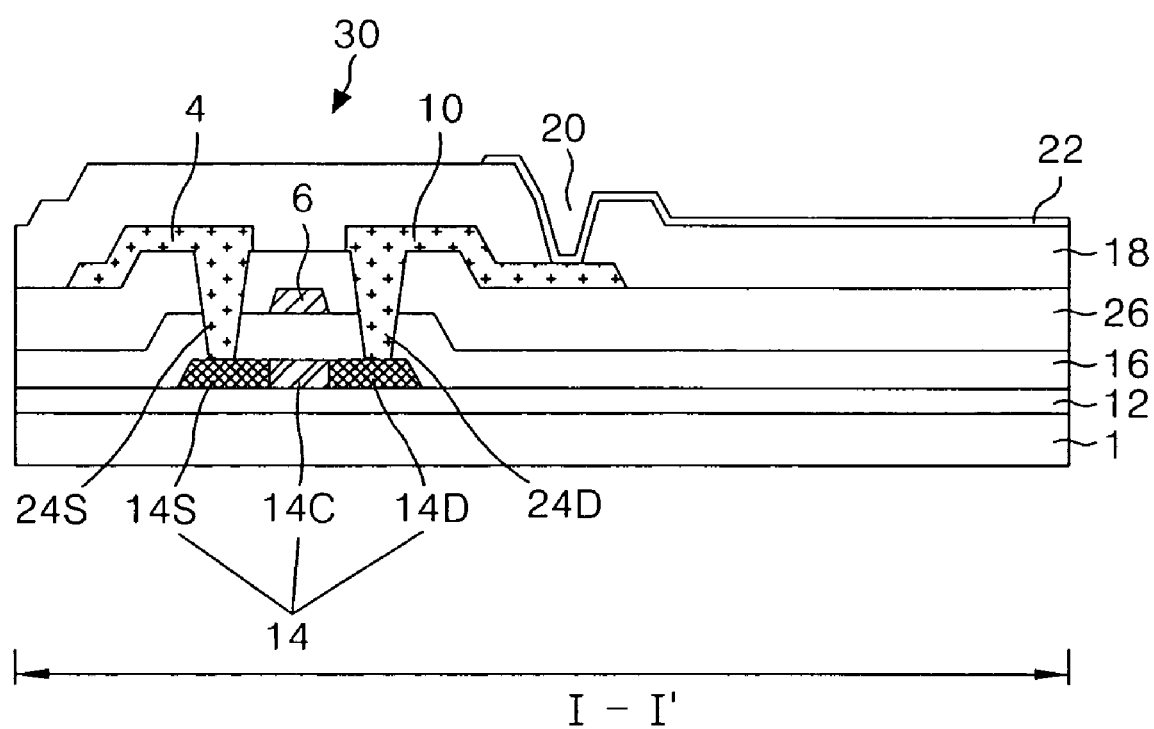
FIG. 3 is a cross-sectional view of the pixel area of the TFT substrate taken along the line I-I' in FIG. 2.
Figure 4:
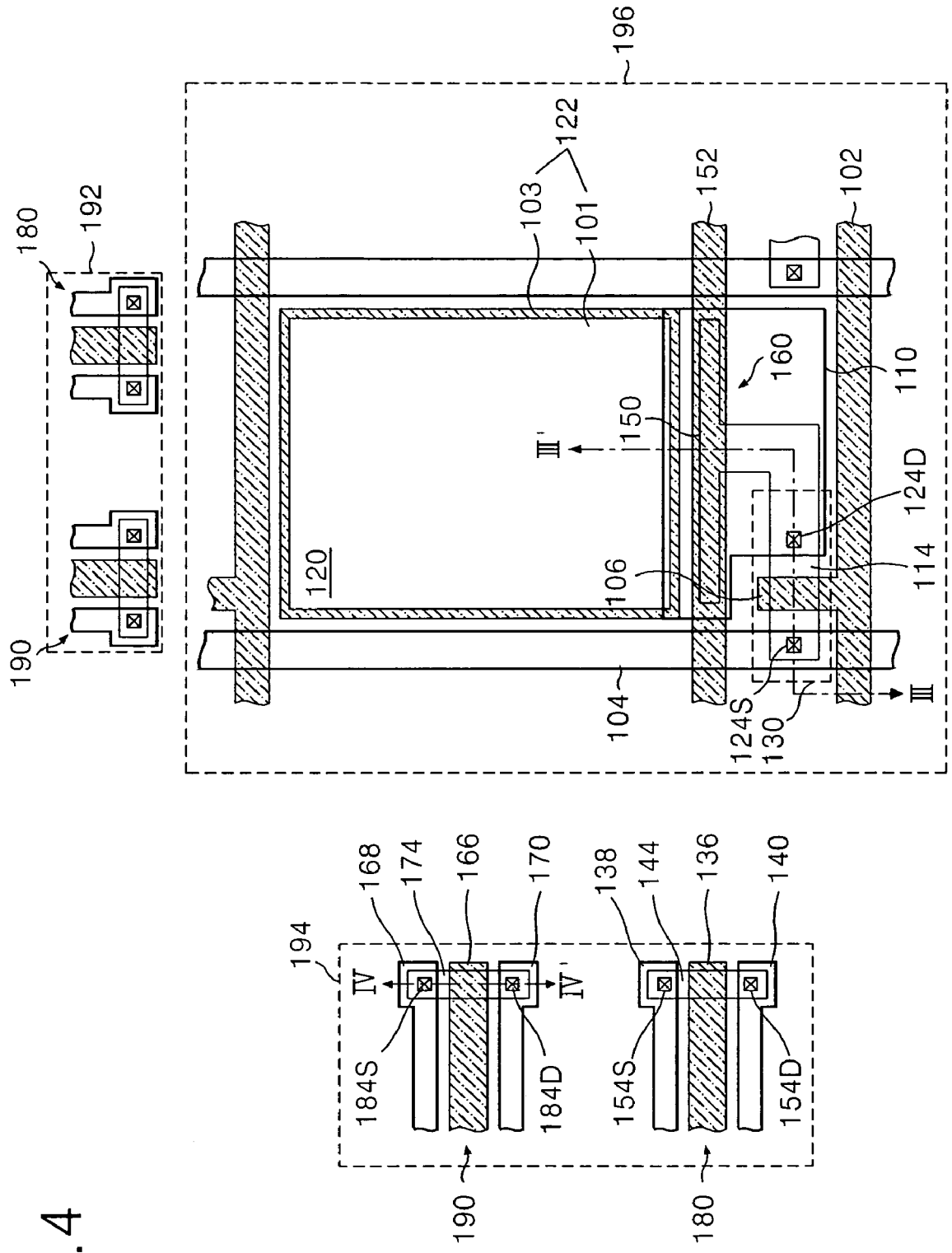
FIG. 4 is a plan view illustrating a portion of a thin film transistor substrate of a poly-silicon display device according to an embodiment of the present invention.
Figure 5:
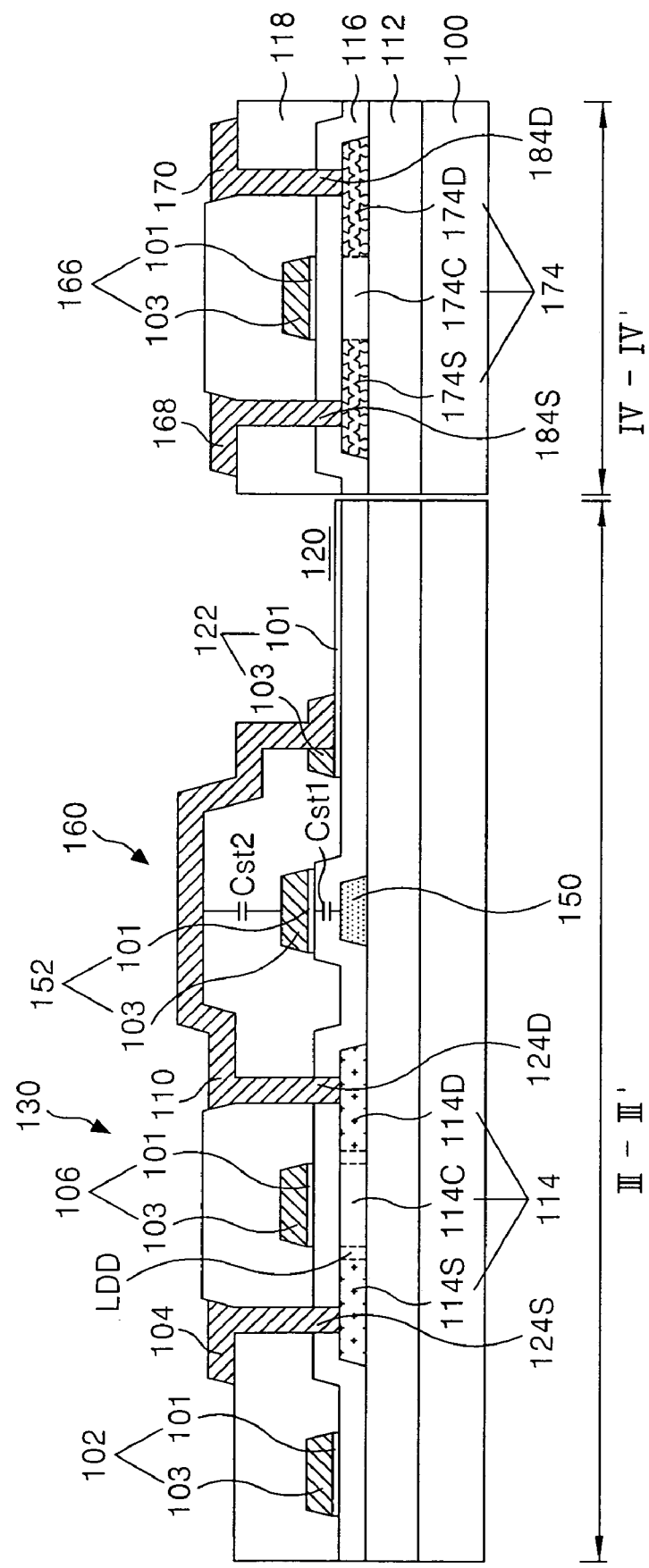
FIG. 5 is a cross-sectional view of the thin film transistor substrate taken along the lines III-III', IV-IV' and V-V' in FIG. 4.

FIG. 4 is a plan view illustrating a portion of a thin film transistor substrate of a poly-silicon display device according to an embodiment of the present invention, and FIG. 5 is a cross-sectional view of the thin film transistor substrate taken along the lines III-III', IV-IV', and V-V', in FIG. 4.

Referring to FIGS. 4 and 5, the thin film transistor (TFT) substrate includes a display area 196, a data driver 192 for driving data lines 104 of the display area 196, and a gate driver 194 for driving gate lines 102 of the display area 196.

The display area 196 includes a first TFT 130 connected to the gate line 102 and the data line 104, a pixel electrode 122 connected to the TFT 130, and a storage capacitor 160. Although the first TFT 130 can be either an NMOS-TFT or PMOS-TFT, the first TFT 130 employing an NMOS-TFT will now be described.

The data line 104 crosses the gate line 102 and a storage line 152 with an interlayer insulating film 118 therebetween to define a pixel area provided with the pixel electrode 122.

The first NMOS-TFT 130 applies a video signal on the data line 104 to the pixel electrode 122 in response to a gate signal from the gate line 102. To this end, the first NMOS TFT 130 includes a first gate electrode 106 connected to the gate line 102, a first source electrode connected to the data line 104, a first drain electrode 110 connected to the pixel electrode 122, and a first active layer 114 for defining a channel between the first source electrode and the first drain electrode 110.

The gate line 102 and the first gate electrode 106, along with the storage line 152, have a double-layer structure in which a metal layer 103 is formed on a transparent conductive layer 101.

The first active layer 114 is formed on a lower substrate 100 with a buffer film 112 therebetween. The first active layer 114 has a channel area 114C overlapping the gate electrode 106 with a gate insulating film 116 therebetween, and a source area 114S and a drain area 114D doped with an $n^+$ impurity. The source area 114S and the drain area 114D of the first active layer 114 are connected to the first source electrode and the first drain electrode 110, respectively, via a first source contact hole 124S and a first drain contact hole 124D passing through the interlayer insulating film 118 and the gate insulating film 116. The first active layer 114 may further include a lightly doped drain (LDD) area (not shown) doped with an $n^-$ impurity between the channel area 114C and the source and drain areas 114S and 114D so as to reduce the off current of the first NMOS-TFT 130.

The pixel electrode 122 includes a transparent conductive layer 101 provided on the gate insulating film 116 in the pixel area, and a metal layer 103 on the transparent conductive layer 101 along a periphery of the transparent conductive layer 101. In other words, the transparent conductive layer 101 of the pixel electrode 122 is exposed through a transmitting hole 120 passing through the interlayer insulating film 118 and the metal layer 103. Alternatively, the pixel electrode 122 may only include the transparent conductive layer 101 without the metal layer 103. The pixel electrode 122 crosses the storage line 152 and is connected to the first drain electrode 110 extended along a side surface of the transmitting hole 120. More specifically, the first drain electrode 110 is connected to the metal layer 103 and the transparent conductive layer 101 of the pixel electrode 122 exposed through the transmitting hole 120.

The TFT 130 charges a video signal into the pixel electrode 122 to generate a potential difference with respect to a common electrode of a color filter substrate (not shown). This potential difference rotates liquid crystal provided between the TFT substrate and the color filter substrate due to the dielectric anisotropy of the liquid crystal, thereby controlling an amount of transmitted light inputted from a light source (not shown) via the pixel electrode 122 toward the color filter substrate.

The storage capacitor 160 includes first and second storage capacitors Cst1 and Cst2 connected in parallel between the storage line 152 and the TFT 130. The first storage capacitor Cst1 is provided such that the storage line 152 overlaps the lower storage electrode 150 extended from the active layer 114 with the gate insulating film 116 therebetween. The second storage capacitor Cst2 is provided such that the drain electrode 110 crosses the storage line 152 with the interlayer insulating film 118 therebetween. Because the storage capacitor 160 includes the first and second storage capacitors Cst1 and Cst2 connected in parallel, it has a high capacitance value. The storage capacitor 160 stably maintains a video signal charged in the pixel electrode 122 during a predetermined period of time.

The gate driver 194 and the data driver 192 has a CMOS structure including a second NMOS-TFT 180 and a PMOS-TFT 190.

The second NMOS-TFT 180 includes a second active layer 144 provided on the buffer film 112, a second gate electrode 136 overlapping a channel area of the second active layer 144 with the gate insulating film 116 therebetween, and a second source electrode 138 and a second drain electrode 140 connected to source and drain areas of the second active layer 144, respectively, via a second source contact hole 154S and a second drain contact hole 154D. The second active layer further includes a channel area, and a lightly doped drain (LDD) area (not shown) doped with an n⁻ impurity between the channel area 114C and the source and drain areas so as to reduce the off current. The second NMOS-TFT 180 has the same structure as the first NMOS-TFT 130 in the display area 196.

The PMOS-TFT 190 includes a third active layer 174 provided on the buffer film 112, a third gate electrode 166 overlapping a channel area 174C of the third active layer 174 with the gate insulating film 116 therebetween, and a third source electrode 168 and a third drain electrode 170 connected to a source area 174S and a drain area 174D of the third active layer 174, respectively, via a third source contact hole 184S and a third drain contact hole 184D. The source area 174S and the drain area 174D of the third active layer 174 are doped with a p-type impurity.

As described above, in the TFT substrate of the poly-silicon display device according to the embodiment of the present invention, the pixel electrode 122, along with a double-layer structure of the gate line 102, the first to third gate electrodes 106, 136 and 166 and the storage line 152, etc., is formed on the gate insulating film 116, thereby simplifying the manufacturing process. As a result, a source/drain metal pattern including the data line 104 having the first source electrode, the second and third source electrodes 138 and 168 and the first to third drain electrodes 110, 140 and 170 has an exposed structure. However, according to the principles of the present invention, the source/drain pattern can be protected by an alignment film or the liquid crystal by positioning the source/drain pattern inside an area sealed by a sealant.

FIG. 6A to FIG. 6G are cross-sectional views illustrating a method of fabricating a TFT substrate of a poly-silicon display device according to an embodiment of the present invention. In the drawings, the second NMOS-TFT 180 included in the gate driver 194 and the data driver 192 is not shown because it has the same structure as the first NMOS-TFT 130 of the display area 196, but it will be described with reference to FIG. 4.

Referring to FIG. 6A, the buffer film 112 is formed on the lower substrate 100, and then the first active layers 114 and the lower storage electrode 150 are formed thereon in the display area and the second and third active layers 144 and 174 are formed in the driver area by a first mask process.

To form the buffer film 112, an inorganic insulating film such as $SiO_2$, etc. is entirely deposited on the lower substrate 100. Next, an amorphous-silicon thin film is formed on the buffer film 112 by a low pressure chemical vapor deposition (LPCVD) technique or a plasma enhanced chemical vapor deposition (PECVD) technique, etc. and then is crystallized to form a poly-silicon thin film. A dehydrogenization process may be performed to reduce hydrogen atoms existing in the amorphous-silicon thin film prior to the crystallization of the amorphous-silicon thin film. A laser annealing (ELA) technique such as the sequential lateral solidification (SLS) can be employed to crystallize the amorphous-silicon thin film, where grains grow in a horizontal direction to enlarge a size of the grains. The poly-silicon thin film is patterned by photolithography and etching processes using a first mask to form the first active layer 114 and the lower storage electrode 150 in the display area and the second and third active layers 144 and 174 in the driver area.

Referring to FIG. 6B, an n⁺ impurity is doped into the lower storage electrode 150 to have a conductivity by a second mask process.

More specifically, a photo-resist pattern exposing the lower storage electrode 150 is formed by a photolithography process using a second mask, and an n⁺ impurity is doped into the lower storage electrode 150, thereby allowing the lower storage electrode 150 to have a conductivity. Then, the photo-resist pattern is removed by a stripping process.

Referring to FIG. 6C, the gate insulating film 116 is formed on the buffer film 112 provided with the first to third active layers 114, 144 and 174 and the lower storage electrode 150, and the pixel electrode 122, along with a double-layer structure of the gate line 102, the first to third gate electrodes 106, 136 and 166 and the storage line 152, is formed thereon by a third mask process.

The gate insulating film 116 is formed by entirely depositing an inorganic insulating film such as $SiO_2$, etc. on the buffer film 112 provided with the first to third active layers 114, 144 and 174 and the lower storage electrode 150. Then, the transparent conductive layer 101 and the metal layer 103 are sequentially formed on the gate insulating film 116 by the sputtering, etc. The transparent conductive layer 101 is formed of indium-tin-oxide (ITO), tin-oxide (TO) or indium-zinc-oxide (IZO), etc., whereas the gate metal layer 103 has at least a single layer formed of a metal material such as Mo, Cu, AlNd, Al, Ti, Cr, a Mo alloy, a Cu alloy or an Al alloy, etc.

Next, the metal layer 103 and the transparent conductive layer 101 are patterned by photolithography and etching processes using a third mask to form the pixel electrode 122 along with the double-layer structure of the gate line 102, the first to third gate electrodes 106, 136 and 166 and the storage line 152.

Referring to FIG. 6D, the source area 114S and the drain area 114D of the first and second active layers 114 and 144 and an LDD area are defined by a fourth mask process.

More specifically, an n⁻ impurity is doped into exposed portions of the first and second active layers 114 and 144 to define the LDD area using the first and second gate electrodes 106 and 136 as a mask. Subsequently, the photo-resist pattern exposing the source area 114S and the drain area 114D of the first and second active layers 114 and 144 is formed by a photolithography process using a fourth mask, and an n⁺ type impurity is doped into the source and drain areas 114S and 114D. The source and drain areas 114S and 114D of the first and second active layers 114 and 144 are positioned between the channel area 114C overlapping the gate electrodes 106 and 136 and the LDD area doped only with an n⁻ impurity. Then, the photo-resist pattern is removed by a stripping process.

Figure 6E:
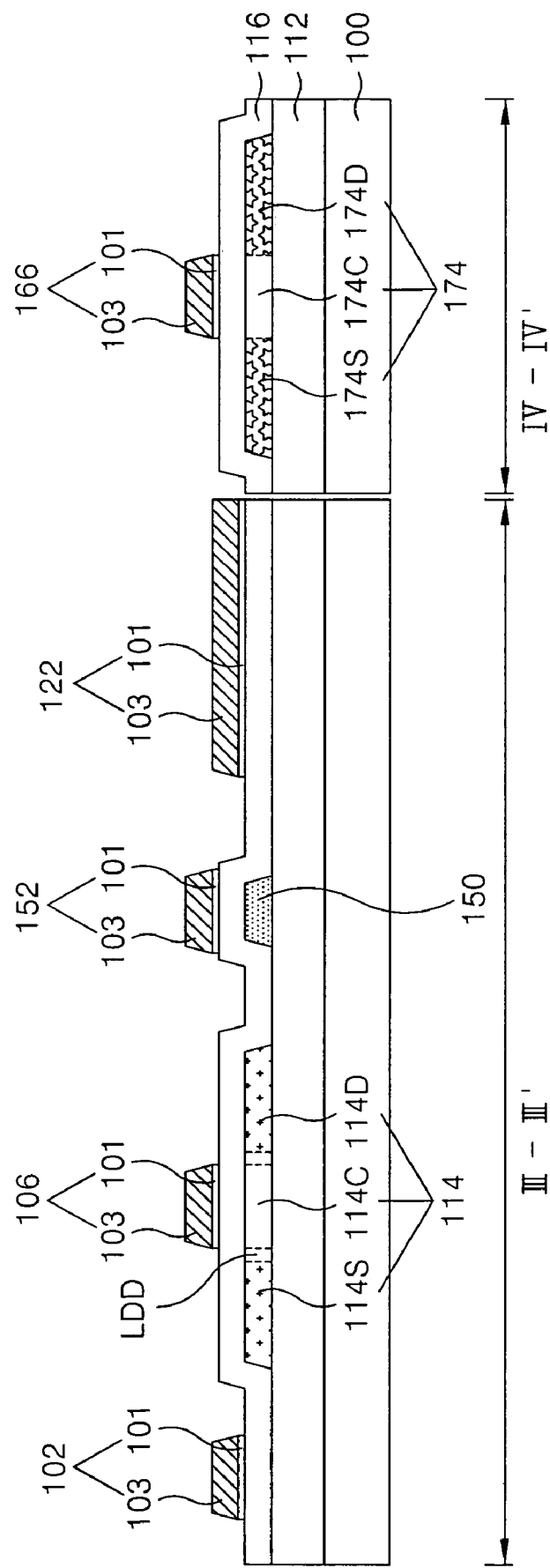

Referring to FIG. 6E, a p⁺ type impurity is doped into the third active layer 174 to form the source area 174S and the drain area 174D of the third active layer 174 by a fifth mask process.

More specifically, a photo-resist pattern exposing the source area 174S and the drain area 174D of the third active layer 174 is provided by a photolithography process using a fifth mask. A p⁺ type impurity is doped into each side area of the exposed third active layer 174 to thereby form the source area 174S and the drain area 174D of the third active layer 174. The source and drain areas 174S and 174D of the third active layer 174 are opposed to each other with the channel area 174C overlapping the third gate electrode 166 therebetween. Then, the photo-resist pattern is removed by a stripping process.

Figure 6F:
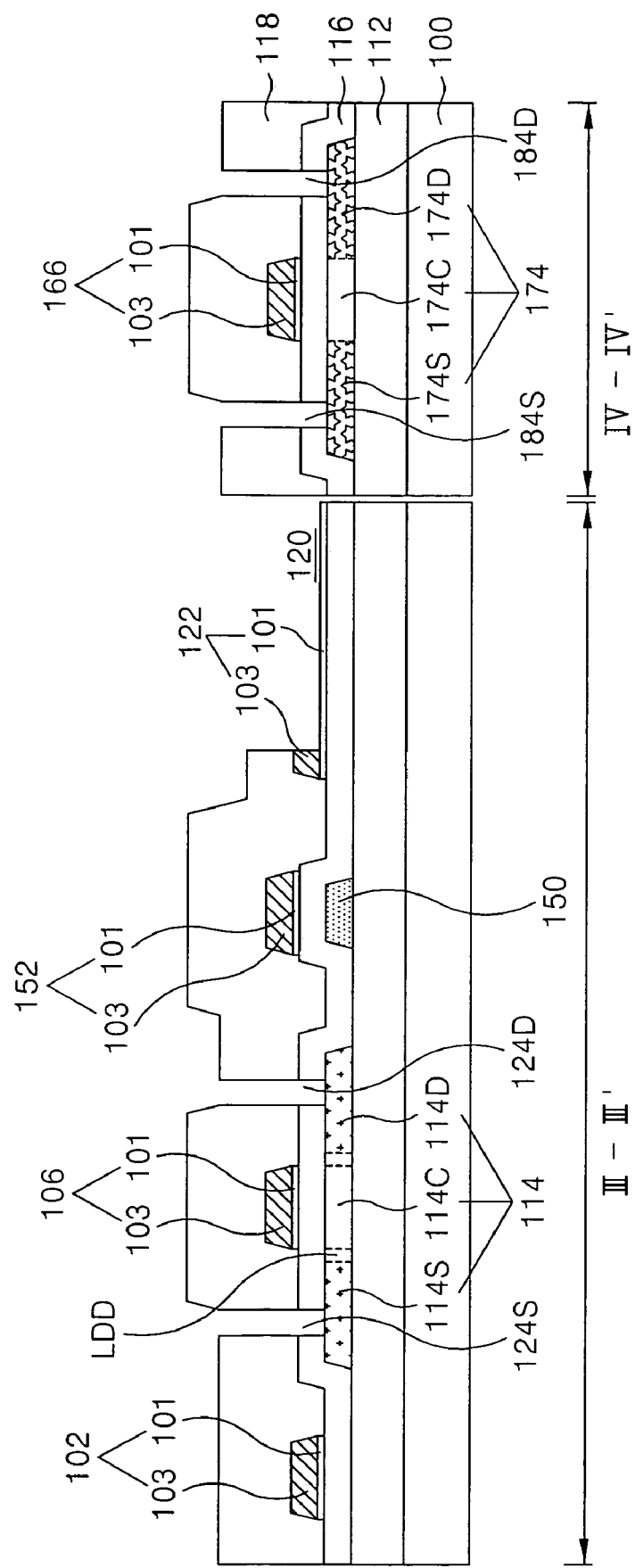

Referring to FIG. 6F, the interlayer insulating film 118 having the source and drain contact holes 124S, 124D, 154S, 154D, 184S and 184D and the transmitting hole 120 is formed on the gate insulating film 116 provided with the gate line 102, the gate electrodes 106, 136 and 166, the storage line 152 and the pixel electrode 122 by a sixth mask process.

The interlayer insulating film 118 is provided by entirely depositing an inorganic insulating material such as $SiO_x$ or $SiN_x$, etc. onto the gate insulating film 116 provided with the gate line 102, the gate electrodes 106, 136 and 166, the storage line 152 and the pixel electrode 122.

Then, the first to third source contact holes 124S, 154S and 184S and the first to third drain contact holes 124D, 154D and 184D passing through the interlayer insulating film 118 and the gate insulating film 116, and the transmitting hole 120 passing through the interlayer insulating film 118 are formed by photolithography and etching processes using a sixth mask. The first to third source contact holes 124S, 154S and 184S expose the source areas 114S, 144S and 174S of the first to third active layers 114, 144 and 174, respectively. The first to third drain contact holes 124D, 154D and 184D expose the drain areas 114D, 144D and 174D of the first to third active layers 114, 144 and 174. The transmitting hole 120 exposes the gate metal layer 103 that is a upper layer of the pixel electrode 122.

Subsequently, the gate metal layer 103 of the pixel electrode 122 exposed through the transmitting hole 120 is etched to expose the transparent conductive layer 101. The gate metal layer 103 overlapping the interlayer insulating film 118 remains at a periphery of the transparent conductive layer 101.

Figure 6G:
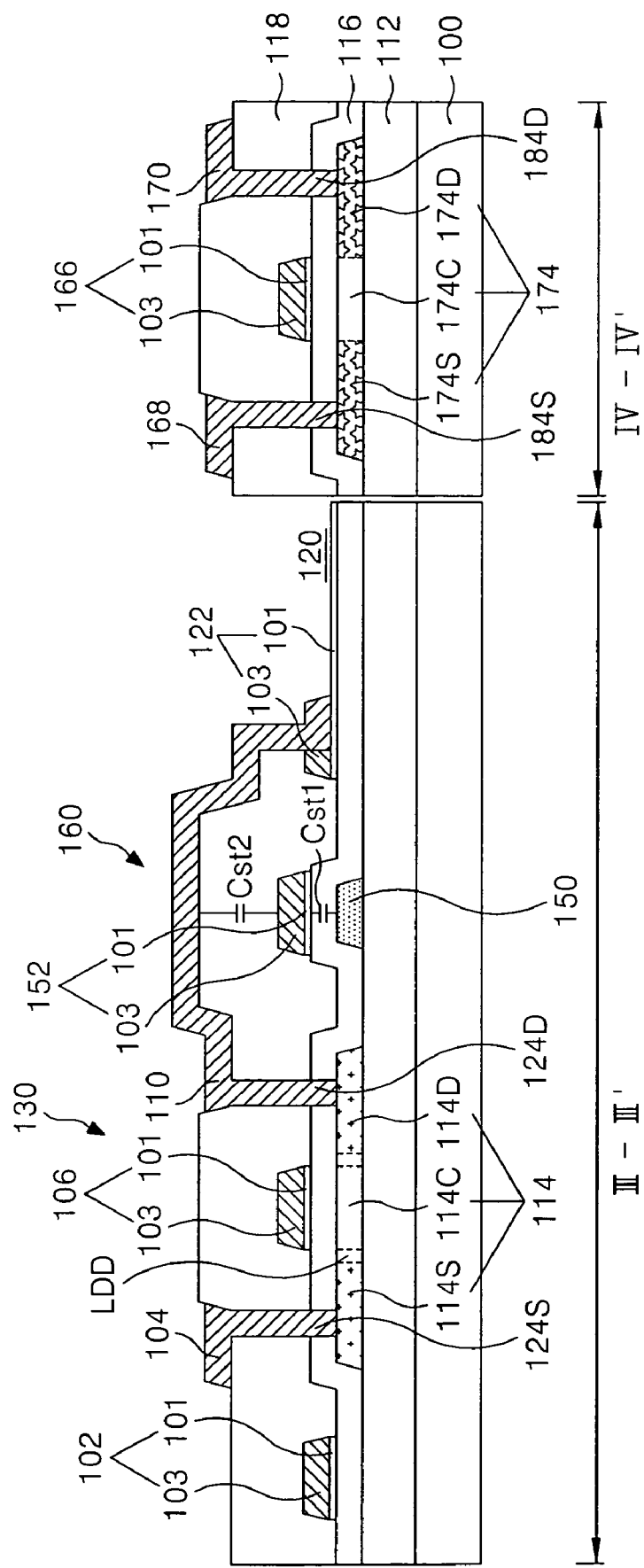

Referring to FIG. 6G, a source/drain metal pattern including the data line 104 having the first source electrode, the second and third source electrodes 138 and 168 and the first to third drain electrodes 110, 140 and 170 are formed on the interlayer insulating film 118 by a seventh mask process.

The source/drain metal pattern is formed by depositing a source/drain metal layer on the interlayer insulating film 118 and then patterning the source/drain metal layer by photolithography and etching processes using a seventh mask. The data line 104 and the first drain electrode 110 are connected to the source and drain areas 114S and 114D of the first active layer 114 via the first source and drain contact holes 124S and 124D. Further, the first drain electrode 110 is connected to the pixel electrode 122 via the transmitting hole 120 in such a manner to overlap the storage line 152. The second source and drain electrodes 138 and 140 are connected to the source and drain areas of the second active layer 144, respectively, via the second source and drain contact holes 154S and 154D. The third source and drain electrodes 168 and 170 are connected to the source and drain areas 174S and 174D of the third active layer 174 via the third source and drain contact holes 184S and 184D.

As described above, the method of fabricating the TFT substrate of the poly-silicon display device according to the embodiment of the present invention is a simplified seven-mask process. The TFT substrate according to the embodiment of the present invention does not include a protective layer and thus the source/drain metal pattern is exposed. However, when all of the source/drain metal patterns are located inside an area sealed by a sealant, they can be sufficiently protected by an alignment film formed thereon as well as the liquid crystal in the sealed area.

As described above, a TFT substrate of a poly-silicon display device integrated with driving circuits according to the present invention is fabricated by a seven-mask process, thereby reducing the fabrication cost and increasing the productivity.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a display device, comprising:
    forming first to third active layers on a substrate, wherein the first active layer is formed in a display area of the substrate and the second and third layers are formed in a driver area of the substrate;
    forming a first insulating film on the active layers;
    directly forming a first conductive pattern including first, second, and third gate electrodes, a gate line connected to the first gate electrode, a storage line, and a pixel electrode on the first insulating film, wherein the first conductive pattern has a double-layer structure in which a metal layer is formed on a transparent conductive layer;
    forming source and drain region doped with a first impurity on the first and second active layers;
    forming source and drain regions doped with a second impurity on the third active layer;
    forming a second insulating film on the first conductive pattern;

forming source and drain contact holes exposing the source and drain regions of the first, second and third active layers and forming a transmitting hole exposing the transparent conductive layer of the pixel electrode; and forming a second conductive pattern including data line and first, second and third source and drain electrodes connected to the source and drain regions of the first, second and third active layers, wherein the first drain electrode is connected to the transparent conductive layer of the pixel electrode.

2. The method of claim 1, further comprising:
forming a lower storage electrode extended from the first active layer; and
forming a storage capacitor by overlapping the lower storage electrode with the storage line.

3. The method of claim 2, wherein the storage line is parallel to the gate line.

4. The method of claim 2, further comprising forming a second storage capacitor by overlapping the storage line with the first drain electrode.

5. The method of claim 2, further comprising doping an impurity into the lower storage electrode.

6. The method of claim 2, further comprising forming an LDD region between a channel region overlapping the first and second gate electrode and the source and drain regions on the first and second active layers.

7. The method of claim 6, wherein the LDD region is formed by doping an n– impurity into each side of the first and second active layers using the first and second gate electrodes as a mask.

8. The method of claim 1, wherein forming the transmission hole includes;
patterning the first insulating film to form the transmission hole; and
exposing the transparent conductive layer of the pixel electrode by etching the metal layer of the pixel electrode through the transmission hole.

9. The method of claim 8, wherein the transmission hole passes through the first insulating film and the metal layer such that the metal layer encloses a periphery of the transmission hole.

10. The method of claim 1, further comprising forming a buffer film between the substrate and the first, second and third active layers.

11. The method of claim 1, wherein the display device is a liquid crystal display device and further includes a liquid crystal layer on the substrate.

12. The method of claim 1, wherein the first drain electrode is in contact with the metal layer of the pixel electrode.

* * * * *